(12) United States Patent
Noda (10) Patent No.: US 8,707,114 B2
(45) Date of Patent: Apr. 22, 2014

(54) SEMICONDUCTOR DEVICE INCLUDING A TEST CIRCUIT THAT GENERATES TEST SIGNALS TO BE USED FOR ADJUSTMENT ON OPERATION OF AN INTERNAL CIRCUIT

(76) Inventor: Hiromasa Noda, Tokyo (JP)

( * ) Notice: Subject to any disclaimer, the term of this patent is extended or adjusted under 35 U.S.C. 154(b) by 569 days.

(21) Appl. No.: 13/071,121

(22) Filed: Mar. 24, 2011

(65) Prior Publication Data
US 2011/0239062 A1    Sep. 29, 2011

(30) Foreign Application Priority Data

Mar. 26, 2010  (JP) ................. P2010-072393

(51) Int. Cl.
*G01R 31/28*  (2006.01)
(52) U.S. Cl.
USPC ........... 714/726; 714/718; 714/727; 714/728; 714/729; 714/730
(58) Field of Classification Search
None
See application file for complete search history.

(56) References Cited

U.S. PATENT DOCUMENTS

| | | | |
|---|---|---|---|
| 7,007,215 B2* | 2/2006 | Kinoshita et al. ............. | 714/745 |
| 7,219,280 B2* | 5/2007 | McNall ......................... | 714/726 |
| 7,805,649 B2* | 9/2010 | Rajski et al. .................. | 714/732 |
| 8,099,642 B2* | 1/2012 | Whetsel ........................ | 714/729 |
| 2002/0032887 A1 | 3/2002 | Kimura et al. | |
| 2004/0001377 A1 | 1/2004 | Kobayashi | |
| 2004/0139376 A1* | 7/2004 | Ohta et al. .................... | 714/724 |
| 2005/0050414 A1* | 3/2005 | Whetsel ........................ | 714/724 |

FOREIGN PATENT DOCUMENTS

| | | |
|---|---|---|
| JP | 2001-243796 | 9/2001 |
| JP | 2002093197 A | 3/2002 |
| JP | 2004030829 A | 1/2004 |

* cited by examiner

*Primary Examiner* — Albert Decady
*Assistant Examiner* — Justin R Knapp (57) ABSTRACT

A semiconductor device includes a decoder, a first register unit, and a second register unit. The decoder generates first and second register control signals in response to an external test code signal. The first register unit is coupled to the decoder. The first register unit receives the first register control signal from the decoder. The first register unit outputs in series a plurality of test signals in response to the first register control signal. The second register unit is coupled to the first register unit. The second register unit receives the first and second register control signals from the decoder. The second register unit receives in series the plurality of test signals from the first register unit in response to the first register control signal. The second register unit outputs in parallel the plurality of test signals in response to the second register control signal.

20 Claims, 7 Drawing Sheets

SEMICONDUCTOR DEVICE INCLUDING A TEST CIRCUIT THAT GENERATES TEST SIGNALS TO BE USED FOR ADJUSTMENT ON OPERATION OF AN INTERNAL CIRCUIT

BACKGROUND OF THE INVENTION

1. Field of the Invention

The present invention generally relates to a semiconductor device. More specifically, the present invention relates to a semiconductor device including a test circuit that generates a test signal to be used for adjustment on operation of an internal circuit.

Priority is claimed on Japanese Patent Application No. 2010-72393, filed Mar. 26, 2010, the content of which is incorporated herein by reference.

2. Description of the Related Art

As semiconductor devices are shrunken, variations in electric characteristics of the semiconductor devices due to variations of manufacturing thereof have increased. The increased variations of the electric characteristics will increase the need to adjust operations of the internal circuit based on a test result, wherein the test result has been obtained by a test of the internal circuit using a test signal generated by a test circuit included in the semiconductor device. The test circuit generates the test signal for adjustment on operation of the internal circuit. The test signal is used to optimize internal power voltage and internal signal timing. The test circuit generates the test signal to adjust internal power voltage and internal signal timing and reduce operating margin of the internal circuit so as to detect malfunction of a semiconductor device and to determine that the semiconductor device with the smaller margin be defective.

Japanese Unexamined Patent Application, First Publication, No. 2001-243796 discloses a semiconductor device that includes a test circuit generating a plurality of test signals.

SUMMARY

In one embodiment, a semiconductor device may include, but is not limited to, a decoder, a first register unit, a second register unit, and a control unit. The decoder activates one first test signal in a plurality of first test signals in response to an external test code signal. The one first test signal is indicated by the external test code signal. The first register unit is electrically coupled to the decoder. The first register unit receives in parallel the plurality of first test signals from the decoder. The first register unit outputs in series the plurality of first test signals as a plurality of second test signals. The second register unit is electrically coupled to the first register unit. The second register unit receives in series the plurality of second test signals from the first register unit. The second register unit outputs in parallel the plurality of second test signals as a plurality of third test signals. The control unit is electrically coupled to the second register unit. The control unit receives in parallel the plurality of third test signals from the second register unit. The control unit controls operation of a memory cell array in response to the plurality of third test signals.

In another embodiment, a semiconductor device may include, but is not limited to, a decoder, a first register unit, and a second register unit. The decoder generates first and second register control signals in response to an external test code signal. The first register unit may be coupled to the decoder. The first register unit may receive the first register control signal from the decoder. The first register unit outputs in series a plurality of test signals in response to the first register control signal. The second register unit may be coupled to the first register unit. The second register unit may receive the first and second register control signals from the decoder. The second register unit receives in series the plurality of test signals from the first register unit in response to the first register control signal. The second register unit outputs in parallel the plurality of test signals in response to the second register control signal.

In still another embodiment, a semiconductor device may include, but is not limited to, a decoder, a plurality of first registers, a plurality of second registers, and a plurality of control circuits. The decoder activates a test signal of a plurality of test signals. The plurality of first registers may be connected in series to each other. The plurality of first registers may be connected in parallel to the decoder. A first register of the plurality of first registers may receive the test signal activated by the decoder. The plurality of first registers may allow the test signal to be sequentially transferred through the series connection of the plurality of first registers. The plurality of second registers may be connected in series to each other. The plurality of second registers may be connected in series to the plurality of first registers. The plurality of second registers may allow the first test signal to be sequentially transferred through the series connection of the plurality of second registers. The plurality of control circuits may be connected in parallel to the plurality of second registers. The plurality of control circuits may receive in parallel the plurality of test signals from the plurality of second registers.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained in detail with reference to FIGS. 6 and 7, in order to facilitate the understanding of the present invention.

Figure 6:
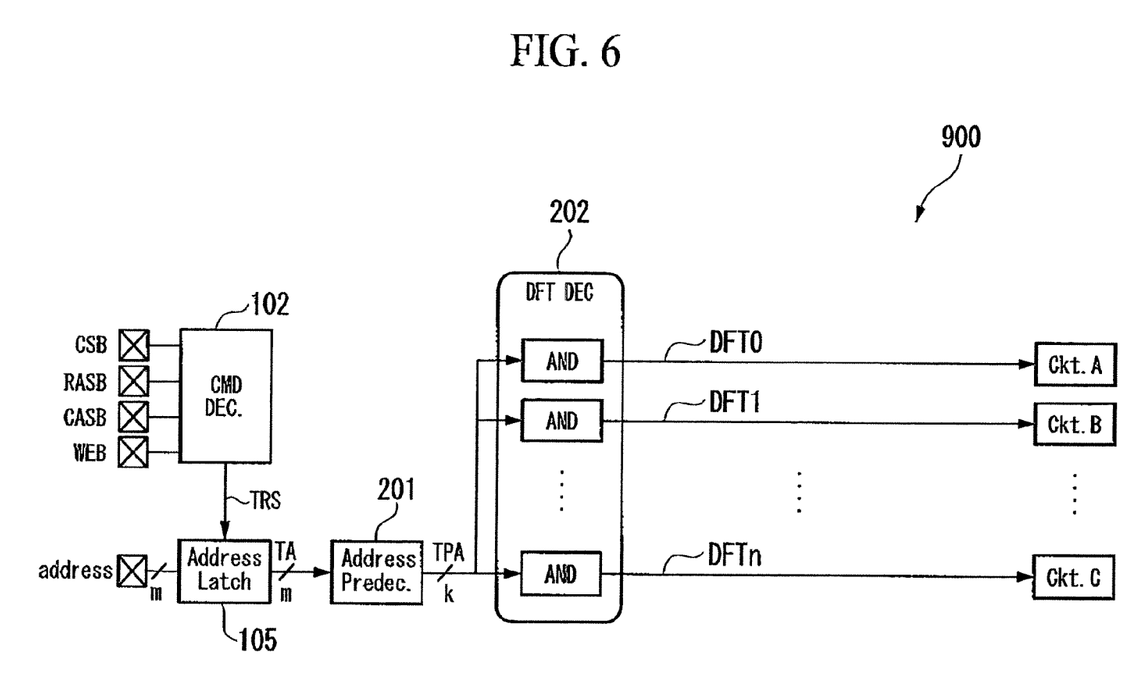
FIG. 6 is a block diagram illustrating circuit configuration to generate a test signal in a semiconductor device in the related art.
Figure 7:
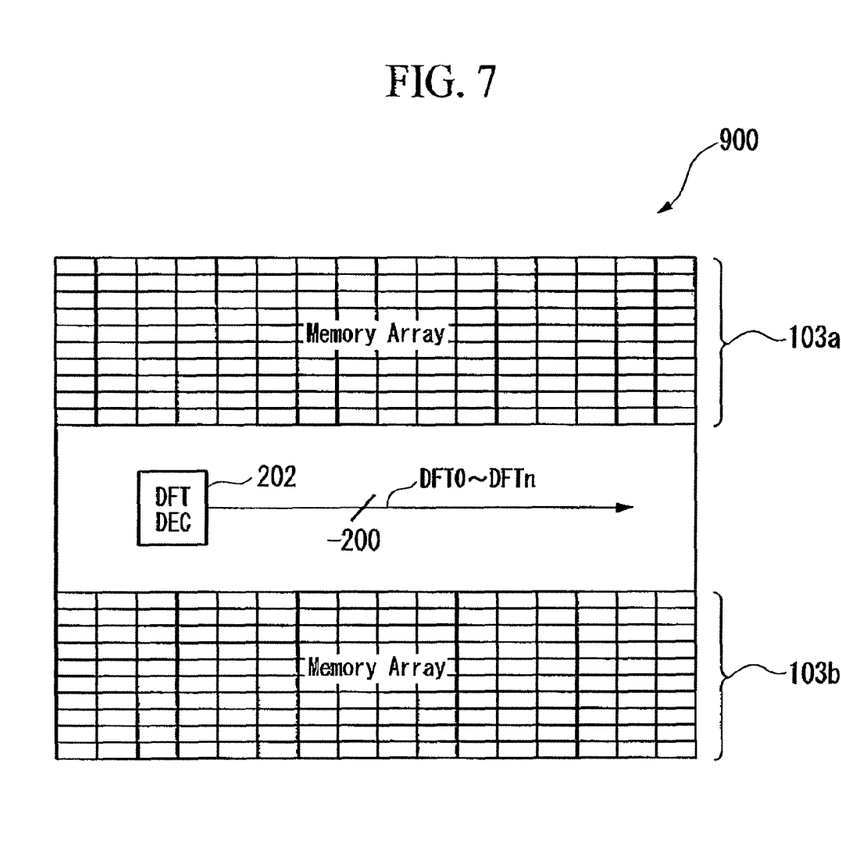
FIG. 7 is a view illustrating layout of the semiconductor device of FIG. 6.

FIG. 6 is a block diagram illustrating circuit configuration to generate a test signal in a semiconductor device in the related art. FIG. 7 is a view illustrating layout of the semiconductor device of FIG. 6. As shown in FIG. 6, a semiconductor device 900 includes a command decoder 102, an address latch 105, an address predecoder 201 and a design for test decoder (DFT decoder) 202. The address latch 105 latches a test code (test address signal) in response to a test command signal TRS generated by the command decoder 102 in test operation. The address latch 105 supplies the latched test address signal TA (m-bits) through the address predecoder 201 to the DFT decoder 202.

The DFT decoder 202 decodes the test pre-decoded address signal TPA (k of signals) to generate test signals DFT0, - - -, DFTn. The DFT decoder 202 supplies the test signals DFT0, - - -, DFTn to target circuits Ckt.A, - - -, Ckt.C through dedicated lines for respective test signals DFT0, - - -, DFTn. The target circuits Ckt.A, - - -, Ckt.C are controlled in test. The number of the dedicated lines is the same as the number of the test signals DFT0, - - -, DFTn. The number of the test signals DFT0, - - -, DFTn is the same as the number of tests for the circuits to be controlled. In some cases, as shown in FIG. 7, about two hundreds of the dedicated lines are provided.

The DFT decoder 202 is connected to the target circuits Ckt.A, - - -, Ckt.C through the same number of the dedicated lines as the test signals, wherein each dedicated line is dedicated to transmit a corresponding one of the test signals. Increase in the number of the target circuits to be controlled in test will increase the number of the dedicated lines, thereby increasing the area of the wiring region in which the dedicated lines are provided. In DDR3-SDRAM, several hundreds of the target circuits are controlled in test, and several hundreds of the dedicated lines are provided. Proportion in area of the wiring region to the chip size is large. Increase in the area of the wiring region will increase the chip size. Increase of the number of the test signals will make it difficult to reduce the chip size.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a decoder, a first register unit, a second register unit, and a control unit. The decoder activates one first test signal in a plurality of first test signals in response to an external test code signal. The one first test signal is indicated by the external test code signal. The first register unit is electrically coupled to the decoder. The first register unit receives in parallel the plurality of first test signals from the decoder. The first register unit outputs in series the plurality of first test signals as a plurality of second test signals. The second register unit is electrically coupled to the first register unit. The second register unit receives in series the plurality of second test signals from the first register unit. The second register unit outputs in parallel the plurality of second test signals as a plurality of third test signals. The control unit is electrically coupled to the second register unit. The control unit receives in parallel the plurality of third test signals from the second register unit. The control unit controls operation of a memory cell array in response to the plurality of third test signals.

In some cases, the first register unit may include, but is not limited to, a plurality of first registers connected to each other. Each of the plurality of first register electrically coupled to the first decoder. Each of the plurality of first registers receives a corresponding first test signal of the plurality of first test signals. Each of the plurality of first registers except for the first register on a final stage of the first register unit transfers the corresponding first test signal as a corresponding second test signal to the first register on a next stage. The first register on the final stage of the first register unit outputs in series the plurality of second test signals.

In some cases, the second register unit may include, but is not limited to, a plurality of second registers connected to each other. The second register on a first stage is electrically coupled to an output of the first register on the final stage of the first register unit. Each of the plurality of second registers except for the second register on a final stage of the second register unit transfers sequentially the corresponding second test signal as a corresponding third test signal to the second register on a next stage.

In some cases, the number of the plurality of first registers is the same as the number of the plurality of second registers.

In some cases, the semiconductor device may further include, but is not limited to, a data output terminal coupled to the second register on the final stage of the second register unit. The second register on the final stage sequentially transfers the third test signals to the data output terminal.

In some cases, the first register on a first stage of the first register unit may receive a fixed potential.

In some cases, the first register on a first stage of the first register unit may receive a first stage input signal having a fixed pattern.

In some cases, the second register on the final stage of the second register unit may be electrically coupled to the first register on a first stage of the first register unit.

In some cases, the control unit may include, but is not limited to, a plurality of control circuits. Each of the plurality of control circuits may be electrically coupled to a corresponding one of the plurality of the second registers. Each of the plurality of control circuits may receive a corresponding one of the plurality of third test signals from the corresponding one of the plurality of the second registers.

In some cases, the plurality of control circuits may be disposed in a peripheral circuit area that is adjacent to the memory cell array, the plurality of second registers are disposed, which have correspondences with the plurality of control circuits.

In some cases, the decoder generates first and second register control signals in response to the test code signal. The decoder supplies the first register control signal to the first register control unit. The decoder supplies the first and second register control signals to the second register control unit.

In some cases, the first register unit may output in series the plurality of first test signals as the plurality of second test signals in response to the first register control signal. The second register unit may receive in series the plurality of second test signals from the first register unit in response to the first register control signal. The second register unit may output in parallel the plurality of second test signals as the plurality of third test signals in response to the second register control signal.

In another embodiment, a semiconductor device may include, but is not limited to, a decoder, a first register unit, and a second register unit. The decoder generates first and second register control signals in response to an external test code signal. The first register unit may be coupled to the decoder. The first register unit may receive the first register control signal from the decoder. The first register unit outputs in series a plurality of test signals in response to the first register control signal. The second register unit may be coupled to the first register unit. The second register unit may receive the first and second register control signals from the decoder. The second register unit receives in series the plurality of test signals from the first register unit in response to the first register control signal. The second register unit outputs in parallel the plurality of test signals in response to the second register control signal.

In some cases, the semiconductor device may further include, but is not limited to, a control unit coupled to the second register unit, the control unit receiving in parallel the plurality of test signals from the second register unit.

In some cases, the semiconductor device may further include, but is not limited to, a memory cell array coupled to the control unit. The control unit controls operations of the memory cell array in response to the plurality of test signals.

In some cases, the second register unit may be disposed closer to the memory cell array than the first register unit.

In some cases, the first register unit may include, but is not limited to a plurality of first registers connected in series to each other. The plurality of first registers may be connected in parallel to the decoder. A first register of the plurality of first registers receives the test signal activated by the decoder. The plurality of first registers allows the test signal to be sequentially transferred through the series connection of the plurality of first registers. The second register unit may include, but is not limited to, a plurality of second registers connected in series to each other. The plurality of second registers may be connected in series to the plurality of first registers. The plurality of second registers may allow the first test signal to be sequentially transferred through the series connection of the plurality of second registers. The control unit may include, but is not limited to, a plurality of control circuits connected in parallel to the plurality of second registers.

In some cases, the semiconductor device may further include, but is not limited to, a data output terminal coupled to the second register on the final stage of the second register unit. The second register on the final stage may sequentially transfer the third test signals to the data output terminal.

In still another embodiment, a semiconductor device may include, but is not limited to, a decoder, a plurality of first registers, a plurality of second registers, and a plurality of control circuits. The decoder activates a test signal of a plurality of test signals. The plurality of first registers may be connected in series to each other. The plurality of first registers may be connected in parallel to the decoder. A first register of the plurality of first registers may receive the test signal activated by the decoder. The plurality of first registers may allow the test signal to be sequentially transferred through the series connection of the plurality of first registers. The plurality of second registers may be connected in series to each other. The plurality of second registers may be connected in series to the plurality of first registers. The plurality of second registers may allow the first test signal to be sequentially transferred through the series connection of the plurality of second registers. The plurality of control circuits may be connected in parallel to the plurality of second registers. The plurality of control circuits may receive in parallel the plurality of test signals from the plurality of second registers.

In some cases, the semiconductor device may further include, but is not limited to, a memory cell array coupled to the control unit. The control unit controls operations of the memory cell array in response to the plurality of test signals.

In the embodiments, the decoder activates one of the plurality of first test signals. The activated first test signal is supplied to one of the plurality of first registers. The activated first test signal is then transferred through the series connection or cascaded connection of the plurality of first registers and then transferred through the series connection or cascaded connection of the plurality of second registers. The test signal that is supplied from the decoder to the control unit can be limited to data transfer signals between the first and second register units 107 and 108 and the control signals that controls the first and second register units. This configuration will need the reduced number of wirings for transferring the test signals. This configuration will need the reduced number of wirings for transferring the test signals even if the increased number of the target circuits is controlled in test. The reduction in the number of the wirings for transferring the test signals will reduce the necessary area for laying out the wirings thereby reducing the chip size. This configuration can avoid increasing the chip size even if the number of the test signals is increased.

A semiconductor device may include a design for test decoder (DFT decoder) that generates a test signal DFT in response to a test code that has been supplied from outside, the test signal being used to adjust characteristics and operations of a target circuit to be controlled in test.

Examples of the target circuit to be controlled in test may be, but are not limited to, delay circuits that delay or accelerate the timing of activation of sense amplifier in DRAMs. In normal operation mode, the sense amplifier is activated after the differential potential is fully caused between paired bit lines after word lines have been selected. Some memory cells may have smaller capacitance than the required capacitance. Such smaller capacitance may be due to manufacturing variation. If the memory cells have smaller capacitance than the required capacitance, the product will be determined to be defective in setting the timing of the normal operation mode. After shipment of the product, the performances of the memory cells can be deteriorated and be defective. The above-described delay circuit may include a switch to make earlier the timing of activation of sense amplifiers, thereby reducing the operational margin of the DRAM. This may allow using accelerated test to reject the defective products previously. If the DRAM has no margin on the evaluation after design, it is possible to confirm whether or not the operational margin can be increased by delaying the timing of the activation of the sense amplifiers by delaying of the timing of the activation of the sense amplifiers. The test signal DFT can be used as a signal which controls the switch in the delay circuit.

The DRAM may include an internal voltage generation circuit as a voltage reducing circuit which may operate memory cells. Reliability test will reject the initial defective. Reliability test will be conducted using a higher voltage for operation of memory cells than when the product shipment. The internal voltage generation circuit may include a by-pass switch which is connected to a voltage generator which generates the different voltage from the internal voltage. The switch is operated to switch between the internal voltage and the other voltage. If the DRAM has no operational margin in evaluation after design, adjustment of the output voltage from the voltage reducing circuit allows for confirming whether the operational margin is changed. The test signal DFT can be used as a signal which controls the by-pass switch.

The DFT decoder generates the above-described test signal in response to the input test code. Increasing the number of the tests will increase the number of the test signals AFT. Increasing the number of the test signals DFT will increase the area for placing the wirings which transmit the test signals DFT. Increase the area for placing the wirings will increase the chip size. This makes it difficult to reduce the chip size.

In accordance with embodiments, the test signals are transmitted in serial to a series of registers, wherein the registers may be daisy-chain-connected in order to reduce the area for placing the wirings which transmit the test signals. The daisychain-connection is a connection in which plural registers are connected in sequence to form a liner topology or in a ring to form a ring topology.

First Embodiment

Figure 1:
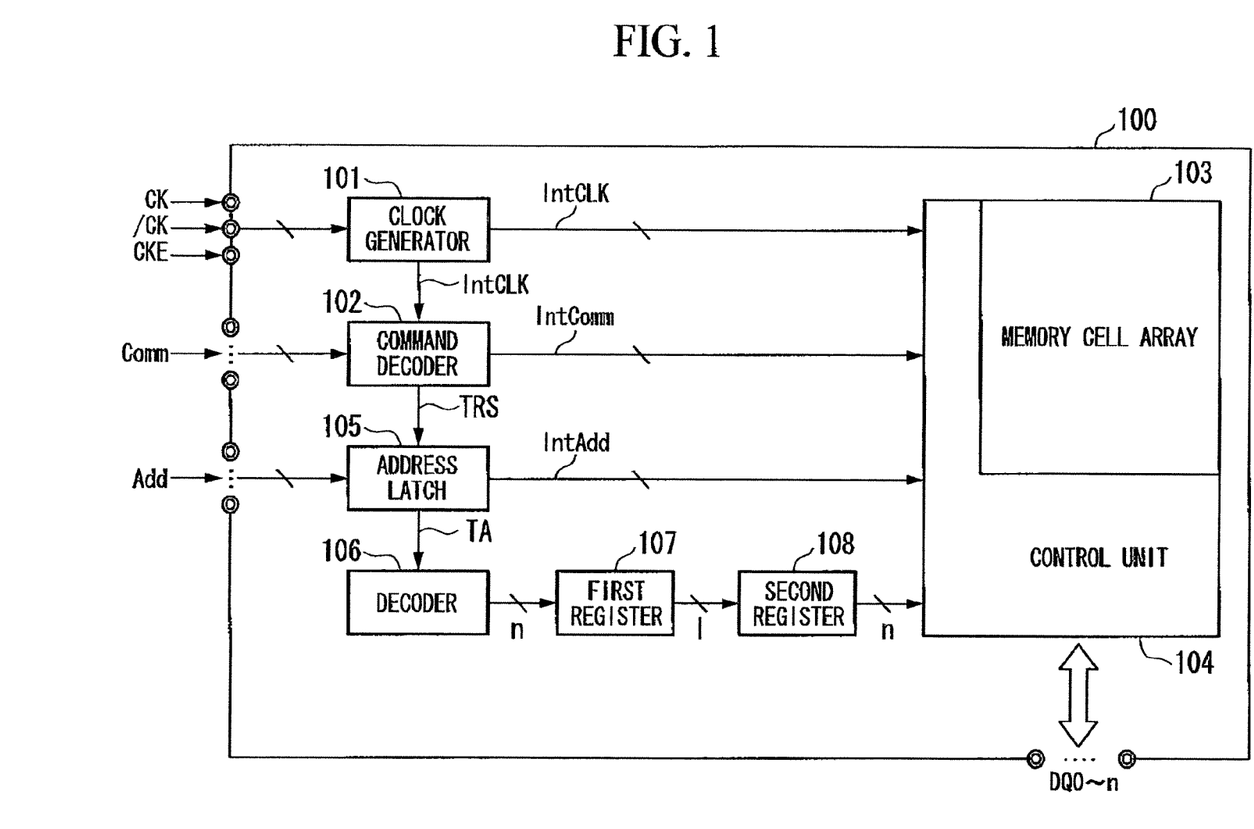
FIG. 1 is a block diagram illustrating the configurations of a semiconductor device in accordance with a first embodiment of the present invention.

FIG. 1 is a block diagram illustrating the configurations of a semiconductor device in accordance with a first embodiment of the present invention, A semiconductor device 100 should not be limited to a particular semiconductor device, but will hereinafter be a semiconductor memory device for illustration of the embodiment.

The semiconductor device 100 may include, but is not limited to, a clock generation circuit 101, a command decoder 102, a memory cell array 103, a read/write control unit 104, an address latch 105, a decoder 106, a first register unit 107 and a second register unit 108.

The clock generation circuit 101 may be configured to receive a clock signal CK, an inverted clock signal /CK as complemented to the clock signal CK, and the clock enable signal CKE which indicates whether the clock signal CK or the inverted clock signal /CK is valid or invalid. The clock generation circuit 101 generates an internal clock signal in response to the clock signals CK, the inverted clock signal /CK and the clock enable signal CKE. The internal clock signal is synchronous with the clock signal CK which is an external clock signal. The clock generation circuit 101 supplies the internal clock signal to the read/write control unit 104 which is an internal circuit included in the semiconductor device 100. Also, the clock generation circuit 101 supplies the internal clock signal to the command decoder 102. The internal clock signal is synchronous with the clock signal CK.

The command decoder 102 may be configured to latch command signals in synchronous with the internal clock signal and then decode the latch command signals. The command signals may include, but is not limited to, a chip select signal CSB, a row address strobe signal RASB, a column address strobe signal CASB and a write enable WEB. The command decoder 102 may be configured to generate a control signal as an internal command signal with reference to the result of decode. The control signal gives instructions to the read/write control unit 104 on operations thereof. The command decoder 102 may be configured to supply the control signal to the read/write control unit 104. The command decoder 102 may be configured to generate, upon receipt of a test command TEST, a test command signal TRS which is synchronous with the internal clock signal. The command decoder 102 may be configured to supply the test command signal TRS to the address latch 105.

The memory cell array 103 may include, but is not limited to, word lines, but limes and an array of memory mats. Each memory mat may include, but is not limited to, a plurality of memory cells, which of which is placed at crossing point of the word line and the bit line.

The memory cell array 103 may further include a plurality of sense amplifiers, word drivers and column switches (Y-switches). The sense amplifier may be configured to amplify data which have been read out on bit line from the memory cell. The word drivers are configured to drive the word lines. The column switches connect the bit lines to IO lines. The sense amplifier may be configured to amplify data signals, which are weak signals, appearing on the bit line, wherein the data signal has been read out of the memory cell. The sense amplifier may be configured to write the data into the memory cell through the bit line in the write operation of the semiconductor memory device. The sense amplifier may be controlled in its operational timings by sense amplifier driving signals which are supplied from row decoders (X-decoders) and row timing circuits (X-timing circuits). The column switch may be controlled in its timings of open and close by column decoders (Y-decoders) and column timing circuits (Y-timing circuits). In the read operation, the column switch (Y-switch) is placed open to allow data on the bit line to be transmitted onto the IO line. The IO line transmits the read data to the read/write control unit 104 which is placed outside the memory cell array 103. In the write operation, the read/write control unit 104 supplies write data onto the IO line, so that the IO line transmits the write data to the bit lines.

The read/write control unit 104 may be configured to control operations of the memory cell array 103. The read/write control unit 104 may include, but is not limited to, the row decoders (X-decoders), the row timing circuits (X-timing circuits), the column decoders (Y-decoders) and the column timing circuits (Y-timing circuits).

The row decoders (X-decoders) and the row timing circuits (X-timing circuits) are configured to receive a row address as an internal address signal which has been supplied from the address latch 105. The row decoders (X-decoders) and the row timing circuits (X-timing circuits) are configured to decode the row address and select a word line which is connected to a memory cell that will be selected in the memory cell array 103 in accordance with the result of decode. The row decoders (X-decoders) and the row timing circuits (X-timing circuits) are configured to control the operational timings of the sense amplifiers which are configured to amplify the potential difference between the paired bit lines.

The column decoders (Y-decoders) and the column timing circuits (Y-timing circuits) are configured to receive a column address as another internal address signal which has been supplied from the address latch 105. The column decoders (Y-decoders) and the column timing circuits (Y-timing circuits) are configured to decode the column address and control, in accordance with the result of decode, the timings of selecting the column switch (Y-switch) connecting the bit line and the IO line. The column decoders (Y-decoders) and the column timing circuits (Y-timing circuits) are configured to control read and write operations, in accordance with the internal command signal which has been supplied to the command decoder 102, and in synchronous with the internal clock signal which has been supplied from the clock generation circuit 101. The read operation is to read data out of the selected memory cell through the TO line. The write operation is to write data into the selected memory cell through the IO line. The column decoders (Y-decoders) and the column timing circuits (Y-timing circuits) are configured to output the data of the memory cell as DQ signals (DQ0, - - -, DQn) in synchronous with the internal clock signal which has been supplied from the clock generation circuit 101. The column decoders (Y-decoders) and the column timing circuits (Y-timing circuits) are configured to receive the DQ signals (DQ0, - - -, DQn) from outside and write the DQ signals (DQ0, - - -, DQn) into the memory cells in synchronous with the internal clock signal which has been supplied from the clock generation circuit 101.

As described above, the read/write control unit 104 may include, but is not limited to the row decoders (X-decoders), the row timing circuits (X-timing circuits), the column decoders (Y-decoders) and the column timing circuits (Y-timing circuits). The row decoders (X-decoders), the row timing circuits (X-timing circuits), the column decoders (Y-decoders) and the column timing circuits (Y-timing circuits) may further include, but is not limited to, the following a control circuit which controls operations of the memory cell array 103. The control circuit may include, but is not limited to, circuits that are configured to change the timings of operations of circuit elements included in the semiconductor device 100. Typical examples of the circuits that are configured to change the timings of operations may include, but are not limited to, circuits configured to accelerate or delay the timings of driving sense amplifier circuits, and delay circuits which are integrated in a signal control system. The signal control system is used to control read and write operations. The control circuit may include, but is not limited to, circuits that are configured to change voltage level of the internal voltage generation circuit. Typical examples of the circuits that are configured to change voltage level may include, but are not limited to, circuits configured to switch an input reference voltage between a higher level and a lower level than the test signal DFT. The input reference voltage is to be input into the internal voltage generation circuit. The control circuit may include, but is not limited to, circuits that are configured to change circuit operations, for example, to validate or invalidate the control signal to change circuit operations. Typical examples of the circuits that are configured to change circuit operations may include, but are not limited to, circuits configured to cause the test signal DFT to activate the inactivated circuit and to deactivate the activated circuit.

The address latch 105 may be configured to latch the address signal, which has been input from outside, in synchronous with the internal clock signal, in the read/write operations. The address latch 105 may be configured to supply the address signal as an internal address signal to the row decoders (X-decoders), the row timing circuits (X-timing circuits), the column decoders (Y-decoders) and the column timing circuits (Y-timing circuits). The address latch 105 may be configured to latch a test address signal TA as the test code signal given from outside, upon the test command signal TRS, in synchronous with the internal clock signal, in the test operation. The address latch 105 may be configured to supply the test address signal TA to the decoder 106.

Figure 2:
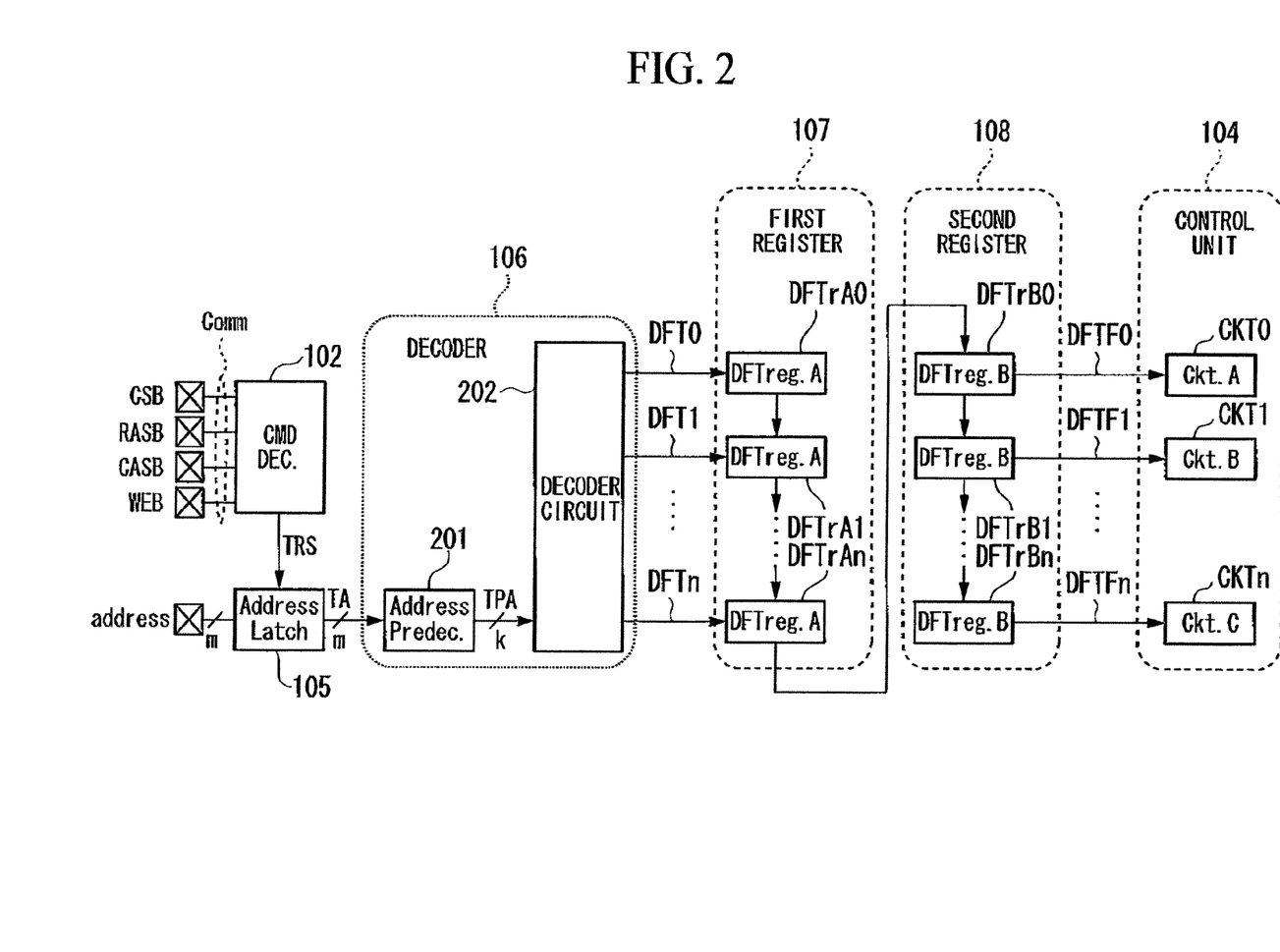
FIG. 2 is a block diagram illustrating the configurations of circuits associated with performing test operations, included in the semiconductor device of FIG. 1.

FIG. 2 is a block diagram illustrating the configurations of circuits associated with performing test operations, included in the semiconductor device of FIG. 1. FIG. 2 illustrates the command decoder 102, the read/write control unit 104, the address latch 105, the decoder 106, the first register unit 107 and the second register unit 108.

The decoder 106 may include, but is not limited to, an address pre-decoder 201 and a decoder circuit 202 (DFT decoder). The address pre-decoder 201 may be configured to receive the test address signal TA of m-bits from the address latch 105. The address pre-decoder 201 may be configured to supply a plurality of test pre-decoded address signals TPA to the decoder circuit 202. The number of the test preaddress signals TPA is k. The address pre-decoder 201 may be configured to classify the test address signal TA of m-bits into a plurality of groups, so as to decode the test address signal TA in each group. The address pre-decoder 201 may be configured to supply results of decode to the decoder circuit 202. In some cases, the address pre-decoder 201 classifies the test address signal TA of 8-bits into three groups, 2-bits-group, 3-bits-group, and 3-bits-group. The address pre-decoder 201 generates four decode-result signals, eight decode-result signals, and eight decode-result signals, from the 2-bits-group, 3-bits-group, and 3-bits-group, respectively. The address pre-decoder 201 supplies the four decode-result signals, the eight decode-result signals, and the eight decode-result signals to the decoder circuit 202. The number "k" of the test pre-decoded address signals TPA is greater than the number "m" of bits of the test address signal TA. Namely, the relationship of k>m is satisfied.

The decoder 202 may be implemented by, but not limited to, AND-gates. The decoder circuit 202 may be configured to receive the test pre-decoded address signal TPA from the address pre-decoder 201. The decoder circuit 202 may be configured to decode the test pre-decoded address signal TPA and generate test signals DFT0, - - -, DFTn. The decoder circuit 202 may be configured to supply the test signals DFT0, - - -, DFTn to the first register unit 107. The decoder circuit 202 may be configured to generate the maximum number $2^m$ of the test signals DFT, where the maximum number is the m-th power of 2. Whereas the decoder circuit 202 may be configured to generate the maximum number $2^m$ of the m-th power of 2 of the DFT signals, FIG. 2 illustrates an example that the decoder circuit 202 is configured to generate the number (n+1) of the test signals DFT0, - - -, DFTn.

The first register unit 107 may include, but is not limited to, the number (n+1) of first registers FDTrA0, - - -, FDTrAn. The first register FDTrAk (0≤k≤n) is connected to the decoder 106. The first register FDTrAk may be configured to receive an input of the test signal DFTk. The first register FDTrAk has an output node which is connected to the first register FDTrAk+1 (0≤k+1≤n) on the next stage. The first register FDTrAn on the final stage is connected to the second register unit 108.

The second register unit 108 may include, but is not limited to, the number (n+1) of second registers FDTrB0, - - -, FDTrBn. The second register FDTrBk has an input node which is connected to the second register FDTrBk−1 (0≤k−1≤n) on the previous stage. The second register FDTrBk may be configured to supply a control test signal DFTFk to a corresponding one of the control circuits CKTk in the read/write control unit 104.

The first register unit 107 includes the first register DFTrA0 on the first stage. The first register DFTrA0 has an input node which is configured to receive an input signal TSIN. The input node of the first register DFTrA0 is connected to a fixed potential which has one of high and low levels.

The second register unit 108 includes the second register DFTrBn on the final stage. The second register DFTrBn has an output node at which an output signal TSOUT appears. The output node of the second register DFTrBn may be configured to be connected through an output buffer to a data terminal DQ, so as to allow monitoring the states of the test signal at the data terminal DQ.

Figure 3A:
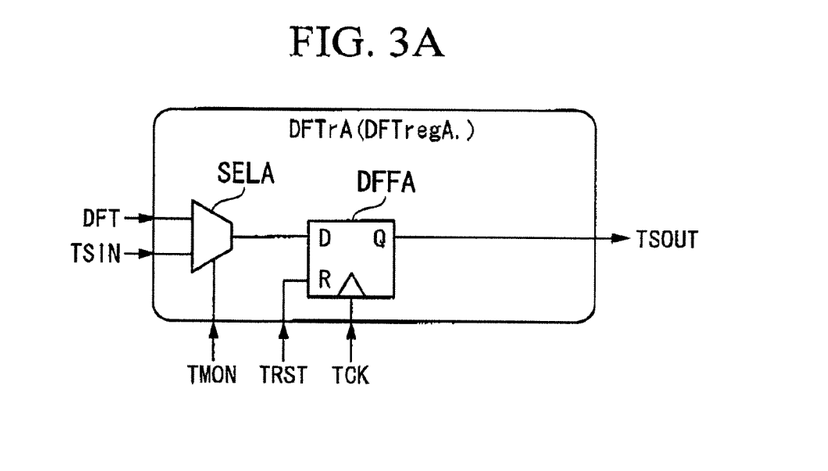
FIG. 3A is a diagram illustrating the configuration of the first register DFTrA included in the circuits of FIG. 2.
Figure 3B:
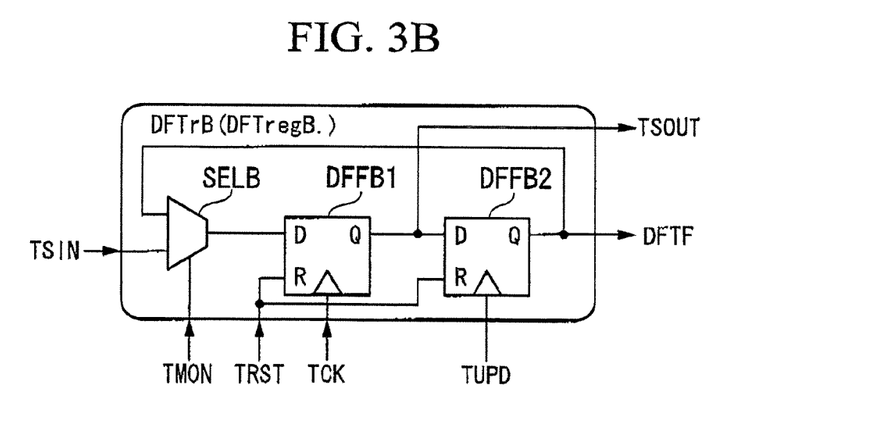
FIG. 3B is a diagram illustrating the configuration of the second register DFTrB included in the circuits of FIG. 2.

FIG. 3A is a diagram illustrating the configuration of the first register DFTrA included in the circuits of FIG. 2, FIG. 3B is a diagram illustrating the configuration of the second register DFTrB included in the circuits of FIG. 2.

The first register DFTrA may include, but is not limited to a selector SELA and a D-flip-flop DFFA.

The selector SELA may be configured to supply the test signal DFT to a data input terminal D of the D-flip-flop DFFA when a register control signal TMON is in high level H. The selector SELA may be configured to supply an input signal TSIN to the data input terminal D of the D-flip-flop DFFA when a register control signal TMON is in low level L. The input signal TSIN is an output signal TSOUT from the D-flip-flop DFFA in the first register DFTrA on the previous stage.

The D-flip-flop DFFA has the data input terminal that may be configured to receive data from the selector SELA. The D-flip-flop DFFA has a clock terminal that may be configured to receive the register control signal TCK. The D-flip-flop DFFA may be configured to latch the data in synchronous with the rising edge of the register control signal TCK. The D-flip-flop DFFA may be configured to hold the data at a data output terminal Q until the next rising edge of the register control signal TCK. The D-flip-flop DFFA may be configured to generate the data as an output signal TSOUT. The D-flip-flop DFFA may be configured to output the output signal TSOUT from the data output terminal Q and supply the output signal TSOUT to the first register DFTrA on the next stage. The first register DFTrA on the final stage may be configured to supply the output signal TSOUT to the second register DFTrB on the first stage.

The D-flip-flop DFFA may be configured to reset the level of the data output terminal Q to the low level when the reset terminal R of the D-flip-flop DFFA receives the register control signal TRST.

The second register DFTrB may include, but is not limited to, a selector SELB a D-flip-flop DFFB1 and a D-flip-flop DFFB2.

The selector SELB may be configured to supply the test signal DFTF to a data input terminal D of the D-flip-flop DFFB1 when a register control signal TMON is in high level H. The test signal DFTF is an output signal from the D-flip-flop DFFB2. To monitor the control test signal DFTF, the data input terminal D of the D-flip-flop DFFB1 is connected to the data output terminal Q of the D-flip-flop DFFB2, so that the D-flip-flop DFFB1 receives the control test signal DFTF. The control test signal DFTF is sequentially transferred to outside of the semiconductor device by using the second register DFTrB for monitoring the control test signal DFTF. The selector SELB may be configured to supply an input signal TSIN to the data input terminal D of the D-flip-flop DFFB1 when the register control signal TMON is in low level L. The input signal TSIN is an output signal TSOUT from the D-flip-flop DFFB1 in the second register DFTrB on the previous stage.

The D-flip-flop DFFB1 has the data input terminal D that may be configured to receive data from the selector SELB. The D-flip-flop DFFB1 has a clock terminal that may be configured to receive the register control signal TCK. The D-flip-flop DFFB1 may be configured to latch the data in synchronous with the rising edge of the register control signal TCK. The D-flip-flop DFFB1 may be configured to hold the data at a data output terminal Q until the next rising edge of the register control signal TCK. The D-flip-flop DFFB1 may be configured to generate the data as an output signal TSOUT. The D-flip-flop DFFB1 may be configured to output the output signal TSOUT from the data output terminal Q and supply the output signal TSOUT to the first register DFTrB1 on the next stage. The D-flip-flop DFFB1 may be configured to supply the output signal TSOUT to the data input terminal D of the D-flip-flop DFFB2, wherein the data input terminal D of the D-flip-flop DFFB2 is connected to the data output terminal Q of the D-flip-flop DFFB1.

The D-flip-flop DFFB2 has the data input terminal D that may be configured to receive data from the D-flip-flop DFFB1. The D-flip-flop DFFB2 has a clock terminal that may be configured to receive a register control signal TUPD. The D-flip-flop DFFB2 may be configured to latch the data in synchronous with the rising edge of the register control signal TUPD. The D-flip-flop DFFB2 may be configured to hold the data at the data output terminal Q. The D-flip-flop DFFB2 may be configured to supply the control test signal DFTF from the data output terminal Q to the read/write control unit 104.

Each of the D-flip-flop DFFB1 and the D-flip-flop DFFB2 may be configured to reset the level of the data output terminal Q to the low level when the reset terminal R of the D-flip-flop DFFA receives the register control signal TRST.

With reference back to FIG. 2, the read/write control unit 104 may include, but is not limited to, control circuits CKT0, - - - , CKTn. The control circuit CKTk has an input which is connected to an output of the second register DFTrBk. As described with reference to FIG. 1, typical examples of the control circuits CKT0, - - - , CKTn may include, but are not limited to, the circuits to change the timings, the circuits to change the voltage level of the internal voltage generation circuit, and the circuits to change circuit operations by validating or invalidating the control signals.

Figure 4:
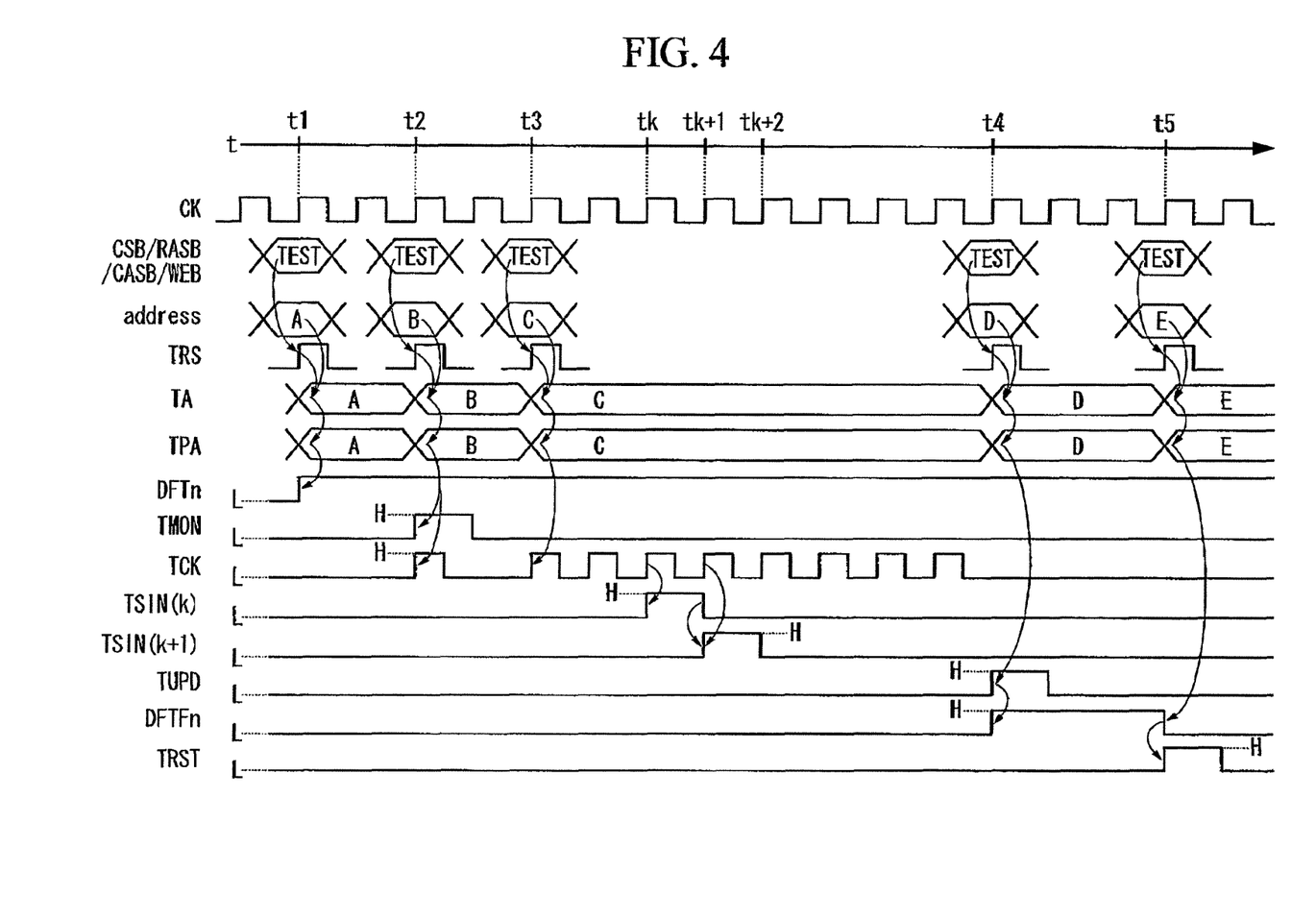
FIG. 4 is a timing chart illustrating operations of the semiconductor device of FIG. 1.

Test operations of the semiconductor device 100 will be described. FIG. 4 is a timing chart illustrating operations of the semiconductor device of FIG. 1. FIG. 4 shows the timings that the semiconductor device 100 fetches the test command TEST and test code signals (addresses A, B, C, D and E) in synchronous with the clock signal CK which has been input from outside, and the semiconductor device 100 generates a test address signal TA, a test pre-decoded address signal TPA, a test signal DFTn, a control test signal DFTFn. FIG. 4 shows the operations of the semiconductor device 100 where a test signal DFTn of the test signals DFT0, - - - , DFTn from the decoder 106 is in the high level H. The register control signals TCK, TMON, TRST and TUPD as described for the circuit configurations of the first and second registers are generated by the decoder 106 using the test pre-decoded address signal TPA.

In some cases, the register control signal TCK may be generated by a clock generation circuit in the decoder 106, in response to the test pre-decoded address signal TPA, where the clock generation circuit for generating the register control signal TCK is placed in the decoder 106.

In other cases, the register control signal TCK may be generated by a first modified configuration where the decoder 106 is configured to generate one cycle of the register control signal TCK, in response to the test preaddress signal TPA, and the decoder 106 generates the predetermined number of the register control signals TCK in response to the predetermined number of inputs of the test pre-decoded address signal TPA.

In other cases, the register control signal TCK may be generated by a second modified configuration where the decoder 106 may include a circuit to control the number of toggles of a clock, and based on the external clock supplied to the semiconductor device 100 from outside, the decoder 106 controls the number of toggles of the external clock to generate the toggle-number-controlled clock as the register control signal TCK.

At a time t1, the command decoder 102 receives the test command (TEST) and generates a test command signal TRS synchronized with an internal clock signal. The command decoder 102 supplies the test command signal TRS to the address latch 105. The address latch 105 latches the address signal (test code signal A) having been input from outside, in synchronous with the test command signal TRS. The address latch 105 supplies the test address signal TA to the decoder 106. In the decoder 106, the pre-decoded address decoder 201 supplies the test pre-decoded address signal TPA to the decoder circuit 202, and the decoder circuit 202 transitions the test signal DFTn into the high level H among the test signals DFT0, - - - , DFTn.

The register control signal of the low level L is input into each selector (SELA, SELB) in the first and second registers. Thus, the input levels of the data input terminals D of the D-flip-flop DFFA and the D-flip-flop DFFB1 are low.

At a time t2, the address latch 105 latches the address signal (test code B) having been input from outside, in synchronous with the test command signal TRS. The address latch 105 supplies the test address signal TA to the decoder 106. The decoder 106 generates a register control signal TMON which is switch signals for all selectors SELA and SELB in the first and second registers. In the first register, all the selectors (SELA) switch the input path to receive the test signal DFTn. The data input terminal D of the D-flip-flop DFFA in each of the first registers DFTrA0, - - -, DFTrAn is connected to the decoder 106.

The decoder 106 generates the register control signal TMON and the register control signal TCK simultaneously one time. Each D-flip-flop DFFA in the first registers DGTrA0, - - -, DFTrAn latches the data (test signals DFT0, - - -, DFTn) input into the data input terminals D. Each D-flip-flop DFFA in the first registers DGTrA0, - - -, DFTrAn holds the latched data at the data output terminal Q.

Only the test signal DFTn is in the high level H. Only the output (output signal TSOUT) from the D-flip-flop DFFA in the first register DGTrAn is in the high level, while the outputs (output signals TSOUT) from the D-flip-flops DFFA in the first registers DGTrA0, - - -, DGTrAn−1 are in the low level.

At a time t3, the address latch 105 latches the address signal (test code signal C) having been input from outside, in synchronous with the test command signal TRS. The address latch 105 supplies the test address TA to the decoder 106. The decoder 106 generates the predetermined number of the register control signals TCK. The decoder 106 generates, (n+1) times, the register control signal TCK in order to transfer the data, which is held by the first register, to the second register since the number of the test signal is n+1. FIG. 4 does not illustrate all of (n+1) of the register control signals TCK. (n+1) of the register control signals TCK are generated in a period of time between t3 and t4. The decoder 106 is maintained at the low level L and not to generate the register control signal TMON, differently from the state thereof at the time t2.

In the first register unit 107, the data input terminal D of the D-flip-flop DFFA in each of the first registers DFTrA0, - - -, DFTrAn has the connections as described below. In the first register DFTrA0, the data input terminal D of the D-flip-flop DFFA is connected to a fixed potential. In each of the first registers DFTrA1, - - -, DFTrAn, the data input terminal D of the D-flip-flop DFFA is connected to the data output terminal Q of the D-flip-flop DFFA or the output of the first register DFTrA on the previous stage.

In the second register unit 108, the data input terminal D of the D-flip-flop DFFB in each of the second registers DFTrB0, - - - , DFTrBn has the connections as described below. In the second register DFTrB0, the data input terminal D of the D-flip-flop DFFB1 is connected to the data output terminal Q of the D-flip-flop DFFA or the output of the first register DFTrAn on the previous stage. In each of the second registers DFTrB1, - - -, DFTrBn, the data input terminal D of the D-flip-flop DFFB1 is connected to the data output terminal Q of the D-flip-flop DFFB1 or the output of the second register DFTrB1 on the previous stage.

Each of the second registers DFTrB0, - - -, DFTrBn receives the input signal TSIN in synchronous with a rising edge of the register control signal TCK, and then output the signal as the output signal TSOUT. The test signal DFTn is transmitted through the series connection of the second registers DFTrB0, - - -, DFTrBn.

A time tk is the time of the k-th rising edge of the register control signal TCK from the time t3. At the time tk, the second register DFTrBk receives, in synchronous with the register control signal TCK, an input signal TSIN(k) which is the output level or the high level from the second register DFTrB (k−1) on the previous stage. The second register DFTrBk holds the high level H of the input signal TSIN(k) until the time (tk+1) of the rising edge of the register control signal. The second register DFTrBk supplies the high level H as the output signal TSOUT to the second register DFTrB(k+1) on the next stage.

At the time (tk+1), the second register DFTrBk+1 receives, in synchronous with the register control signal TCK, an input signal TSIN(k+1) which is the output level or the high level from the second register DFTrB(k) on the previous stage. The second register DFTrBk+1 holds the high level H of the input signal TSIN(k+1) until the time (tk+2) of the rising edge of the register control signal. The second register DFTrBk+1 supplies the high level H as the output signal TSOUT to the second register DFTrB(k+2) on the next stage.

The test signal DFTn is transmitted through the series connection of the second registers DFTrB0, - - -, DFTrBn. In the second register DFTrBn, the data output terminal Q of the D-flip-flop DFFB1 is transitioned to the high level, in synchronous with the (n+1)-th rising edge of the register control signal TCK. The data output terminal Q of the D-flip-flop DFFB1 is connected to the data input terminal D of the D-flip-flop DFFB2, so that the data input terminal D of the D-flip-flop DFFB2 is transitioned to the high level H.

At a time t4, the address latch 105 lathes the address signal (test code signal D) having been input from outside, in synchronous with the test command signal TRS. The address latch 105 supplies the test address signal TA to the decoder 106. The decoder 106 generates the register control signal TUPD. The decoder 106 prohibits the first and second register units 107 and 108 from performing the shift operations of the test signal DFT. The decoder 106 does not generate the register control signals TCK and TMON.

In the second register DFTrBn, the data input terminal D of the D-flip-flop DFFB2 is in the high level H. The D-flip-flop DFFB2 supplies the high level H of the control test signal DFTFn to the control circuit CKTn in the read/write control unit 104 in response to the rising edge of the register control signal TUPD. The control circuit CKTn is in the adjusted state. The control circuit CKTn adjusts the timings of reading and writing operations of the memory cell array 103, differently from those in the normal operation mode. The control circuit CKTn adjusts properties and operations of the memory cell array 103, differently from those in the normal operation mode.

In the second registers DFTrB0, - - -, DFTrB(n−1), the data input terminal D of the D-flip-flop DFFB2 is in the low level L. The second registers DFTrB0, - - -, DFTrB(n−1) supply the control test signals DFTF0, - - -, DFTF(n−1) to the control circuits CKT0, - - -, CKT(n−1).

At a time t5, the address latch 105 latches the address signal (test code signal E) having been input from outside in synchronous with the test command signal TRS. The address latch 105 supplies the test address signal TA to the decoder 106. The decoder 106 generates the register control signal TRST. All of the registers are reset to the default state, where the output signal TSOUT is in the low level L.

As described above, the output (output signal TSOUT) of the second register DFTrBn on the final stage in the second register unit 108 is connected through the output buffer of the semiconductor device to the data terminal DQ. In order to monitor the data terminal DQ to monitor the test signal, the test code signals are input again to generate, (n+1) times, the register control signals TCK in a period of time between the time t4 and the time t5. Before input of the test code C, the test code A is input again, so that the data held in the D-flip-flops DFFB2 in the second registers DFTrB0, - - -, DFTrBn are input into the D-flip-flops DFFB1 in the second registers DFTrB0, - - -, DFTrBn, respectively.

The semiconductor device 100 includes the decoder 106 that activates the predetermined first test signal which is indicated by the test code signal in the first test signals (DFT0, - - -, DFTn), the activation being performed in response to the test code signal (address) having been supplied from outside. The semiconductor device 100 further includes the first register unit 107 which is connected to the decoder 106. The first register unit 107 receives the first test signals which are supplied in parallel from the decoder 106. The first register unit 107 outputs in series the first test signals as the second test signals. The semiconductor device 100 further includes the second register unit 108 which is connected to the first register unit 107. The second register unit 108 receives the second test signals which are supplied in parallel from the first register unit 107. The second register unit 108 outputs in series the second test signals as the third test signals (DFTF0, - - -, DFTFn). The semiconductor device 100 further includes the read/write control unit 104 which is connected to the second register unit 108. The read/write control unit 104 receives the third test signals which are supplied in parallel from the second register unit 108. The read/write control unit 104 controls the operations of the memory cell array 103 in response to the third test signals.

The first register unit 107 includes a series connection of the first registers DFTrA, each of which is connected to the decoder 106. Each of the first registers DFTrA receives a corresponding one of the first test signals. The first test signals are transferred as the second test signals through the series connection of the first registers DFTrA0, - - -, DFTrAn–1 on the non-final stages except the first register DFTrAn on the final stage. The first register DFTrAn on the final stage outputs in series the second test signals.

The second register unit 108 includes a series connection of the second registers DFTrB. The second register DFTrB0 on the first stage in the second registers is connected to the output of the first register on the final stage. The second test signals are transferred as the third test signals through the series connection of the second registers DFTrB0, - - -, DFTrBn–1 on the non-final stages except the second register DFTrBn on the final stage.

The decoder 106 activates one of the test signals (DFT0, - - -, DFTn). The activated test signal is input into one of the first registers. The activated test signal is sequentially transferred through the first registers and the second registers which are connected to the control circuits that control the operations of the memory cell array. The test signals, which the decoder 106 activating the test signals transfers to the read/write control unit 104 controlling the operations of the memory cell array, are data transfer signals (the output signal TSOUT) between the first and second registers and the register control signals (TCK, TMON, TRST, TUPD) which control the first and second registers. The test signals that the decoder 106 transfers to the read/write control unit 104 are reduced to the transfer signals (the output signal TSOUT) and the first and second registers and the register control signals (TCK, TMON, TRST, TUPD). This configuration uses the smaller number of the wirings for the test signals to transfer the test signals than the number of the wirings for the test signals which are used in the related art. It is possible to reduce the area for writings for the test signals reducing the chip size while increasing the number of the circuits to be controlled in the test. It is possible to reduce the chip size with the increased number of the test signals.

Figure 5:
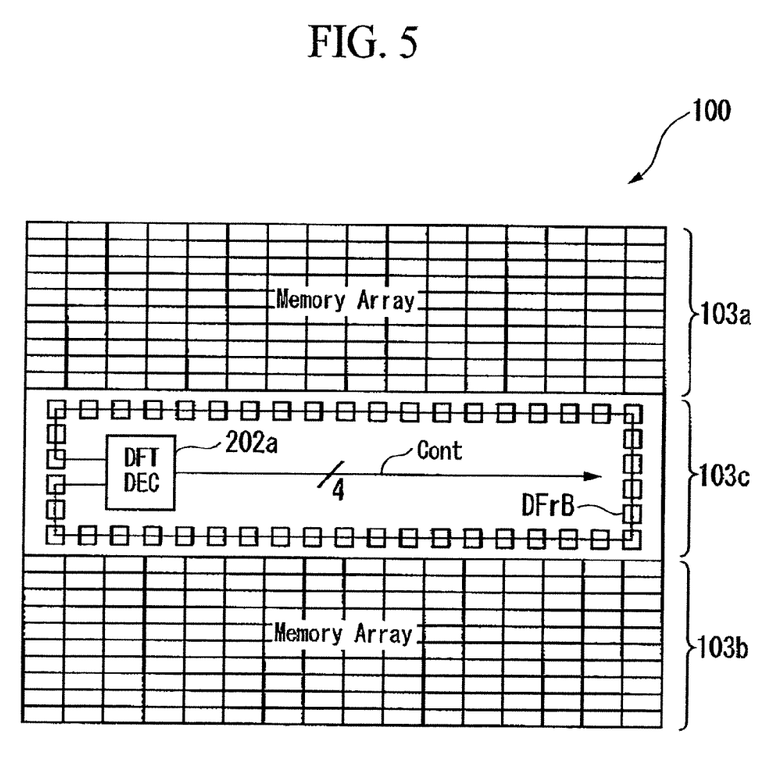
FIG. 5 is a view illustrative a layout of the semiconductor device of FIG. 1.

Layout of the semiconductor device 100 will be described. FIG. 5 is a view illustrative a layout of the semiconductor device 100. The same elements or structures between FIGS. 1 and 5 are assigned with the same reference numbers and duplicate descriptions of the operations of the semiconductor device 100 will be omitted.

The semiconductor device may include, but is not limited to, the memory cell array 103 which includes a peripheral circuit area. In some cases, the memory cell array 103 shown in FIG. 1 may be, but not essentially, divided into two memory cell areas 103a and 103b and a peripheral circuit area 103c. The peripheral circuit area 103c is interposed between the memory cell areas 103a and 103b. The peripheral circuit area 103c may include, but is not limited to, the clock generation circuit 101, the command decoder 102, the read/write control unit 104, the address latch 105, the decoder 106, and the first and second register units 107 and 108. In FIG. 5, the decoder 106 and the first register unit 107 together form a decoder 202a. The second register unit 108 includes a plurality of the second registers DFTrB which are aligned along the sides of the peripheral circuit area 103c. The second registers DFTrB are arranged corresponding to the control circuits CKT. This layout allows the semiconductor device 100 to transfer the test signal DFT through the series connection or the daisy-chain of the second registers DFTrB in the clockwise direction. The series connection of the second registers DFTrB may be the daisy-chain. The control circuits CKT are disposed near the second registers DFTrB. The control circuits CKT control or adjust the operations of the memory cell arrays 103a and 103b. The layout of the control circuits CKT may be decided in view of the requested test. The test signal DFT that needs to adjust the operations of the memory cell arrays are supplied from the daisy-chained second registers DFTrB. The semiconductor device 100 does not need the same number of the writings dedicated to transfer the test signals as the number of the test signals, even the related art need the same number of the writings. The semiconductor device 100 does need the reduced number of the wirings which are laid out in the peripheral circuit area. The semiconductor device 100 needs the wirings in the peripheral circuit area 103, wherein the wirings are used to transfer the register control signals. This layout may allow the peripheral circuit area 103 to be smaller than that of the layout of the related art. This layout may more efficiently suppress increasing the area of the peripheral circuit area 103 with increasing the number of the test signals.

As shown in FIG. 5, in some cases, the memory cell array 103 may be divided into the first and second memory cell array areas 103a and 103b, and the peripheral circuit area 103c. The peripheral circuit area 103c is disposed between the first and second memory cell array areas 103a and 103b. In the peripheral circuit area 103c, the decoder 106, the first and second register units 107 and 108 and the read/write control unit 104 may be laid out. The daisy-chained second registers 108 may be disposed in the side region of the peripheral circuit area 103c.

The layout of the divided first and second memory cell array areas 103a and 103b may be optional, but is not essential. In other cases, the memory cell array 103 may be disposed in a single non-divided memory cell array area. In still other cases, the memory cell array 103 may be divided into three or more divided memory cell array areas. The plurality of control circuits CKT is disposed in the peripheral circuit. The plurality of control circuits CKT is disposed near the memory cell array 103. The second registers 108 are disposed respectively correspondent to the plurality of control circuits CKT.

The decoder 106 in the semiconductor device 100 may be configured to use the same decoding method as the known method of the related art. The semiconductor device 100 can be tested in the same way as the related art by incorporating the known test problem used in the related art with the sequence corresponding to the test codes (address inputs A, B, and C) described with reference to FIG. 4.

As described above, the decoder 106 receives an input of the test code signal A (the first test code signal A) and generates the test signals DFT0, - - - , DFTn. The decoder 106 may include, but is not limited to, a first decoder control unit, a second decoder control unit, and a third decoder control unit. The first decode unit may be configured to receive a second test code signal B and causes the first registers DFTrA0, - - - , DFTrAn to latch the test signals respectively. The first decode unit may be configured to generate the register control signals TMON and TCK. The register control signals TMON and TCK cause the first registers DFTrA0, - - - , DFTrAn to latch the test signals respectively. The second decode unit may be configured to receive a third test code signal C and to causes the second registers DFTrB0, - - - , DFTrBn to latch the test signals as latched by the first registers DFTrA0, - - - , DFTrAn, respectively. The second decode unit may be configured to generate the predetermined number (n+1) of the register control signals TCK. The predetermined number (n+1) of the register control signals TCK cause the first registers DFTrB0, - - - , DFTrBn to latch the test signals respectively. The third decode unit may be configured to receive a fourth test code signal D and to causes the second registers DFTrB0, - - - , DFTrBn to supply the test signals as latched to the control circuits CKT0, - - - , CKTn, respectively. The third decode unit may be configured to generate the register control signals TUPD. The register control signals TUPD cause the second registers DFTrB0, - - - , DFTrBn to supply the test signals as latched to the control circuits CKT0, - - - , CKTn, respectively.

The method of testing the semiconductor device 100 may include, but is not limited to, the first process to input the first test code signal in the related art, the second process to input the second test code signal, the third process to input the third test code, and the fourth process to input the fourth test code. The method can provide the test method which adjusts the operations of the memory cell array as similarly to the related art. A program to be executed by a computer to perform the method of testing the semiconductor device 100 may be obtained by adding the first process to input the first test code signal in the related art with the second process to input the second test code signal, the third process to input the third test code, and the fourth process to input the fourth test code.

The foregoing embodiments may be applicable to any other semiconductor devices such as SOC, SIP, and POP. The foregoing embodiments may also be applicable to semiconductor devices such as CPU, MCU, DSP and semiconductor memory devices.

The transistors used for the circuits such as logic circuits or the function units may be various field effect transistors, such as MOS field effect transistors, MIS field effect transistors, and TFTs. The transistors used for the circuits such as logic circuits or the function units may also be other transistors than the field effect transistors. The transistors used for the circuits such as logic circuits or the function units may also be bipolar transistors.

In some cases, the same test signal may be used by the control circuits CKT. In this case, the first register unit 107 may be configured to include a plurality first registers DFTrA which latch the same test signal DFT. The second registers DFTrB in the second register unit 108 are configured to be connected to supply the same test signal DFTF to the necessary ones of the control circuits CKT for the test signal DFTF. If for example the control circuits CKT0 and CKTn need the test signals DFT0, then the first registers DFTrA0 and DFTrAn latch the same level (high level H) of the same test signal DFT0. (n+1) times of the above-described shift operations are performed to supply the high level (H) of the control test signals DFTF0 and DFTFn from the second registers DFTrB0 and DFTrBn to the control circuits CKT0 and CKTn.

In other cases, the test signal may be controlled by using fuses. The second registers DFTrB of the second register unit 108 closer to the control circuits CKT subjected to the test control in the test operation are configured to receive fuse signals from the fuses. The fuse signals from the fuses and the output signals TSOUT from the D-flip-flop DFFB2 may be subjected to logic operations such as OR-operation and EOR operation.

The first register DFTrA0 on the first stage of the first register unit 107 has the input node to receive the input signal TSIN. In some cases, the input node of the first register DFTrA0 may be connected to the fixed potential. In other cases, the input node of the first register DFTrA0 may be connected to an output of a pattern generator which is configured to generate pattern signals, for example, HHLL-HHLL. The first register DFTrA0 may be configured to receive the pattern signals from the pattern generator. This configuration makes it easier to determine the end of the test signal when the actual state of the test signal is monitored at the data terminal D.

The first register DFTrA0 on the first stage of the first register unit 107 has the input node to receive the input signal TSIN. In some cases, the input node of the first register DFTrA0 may be connected to the fixed potential. In other cases, the input node of the first register DFTrA0 may be connected to an output node of the second register DFTrBn on the final stage of the second register unit 108. All the first registers DFTrA for the first register unit 107 may be configured to have the same circuit configurations since the second register DFTrBn on the previous stage performs as the previous stage register to the first register DFTrA0 on the first stage of the first register unit 107.

In some cases, the decoder 106 may be configured to generate the register control signals TCK, TMON, TRST and TUPD. In other cases, another control circuit may be provided for controlling the register circuits.

In some cases, all the control test signals DFTF may be generated by the method described in the foregoing embodiments. In other cases, only parts of the control test signals DFTF may be generated by the method described in the foregoing embodiments, while the remaining control test signals are generated by the method in the related art. For example, the known method in the related art can be used for the test signals which are often used in wafer test or determination test after assembly, and the method of the foregoing embodiments can be used for the other test signals for other evaluations. This can reduce the wiring area with avoiding increasing the times necessary for wafer test and determination test.

The term "configured" is used to describe a component, section or part of a device includes hardware and/or software that is constructed and/or programmed to carry out the desired function.

The embodiments of methods, software, firmware or codes described above may be implemented by instructions or codes stored on a machine-accessible or machine readable medium. The instructions or codes are executable by a processing element or processing unit. The machine-accessible/readable medium may include, but is not limited to, any mechanisms that provide, store and/or transmit information in a form readable by a machine, such as a computer or electronic system. In some cases, the machine-accessible/readable medium may include, but is not limited to, random-access memories (RAMS), such as static RAM (SRAM) or dynamic RAM (DRAM), read-only memory (ROM), magnetic or optical storage medium and flash memory devices. In other cases, the machine-accessible/readable medium may include, but is not limited to, any mechanism that receives, copies, stores, transmits, or otherwise manipulates electrical, optical, acoustical or other form of propagated signals such as carrier waves, infrared signals, digital signals, including the embodiments of methods, software, firmware or code set forth above.

Furthermore, the particular features, structures, or characteristics may be combined in any suitable manner in one or more embodiments.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
   a decoder that activates one first test signal in a plurality of first test signals in response to an external test code signal, the one first test signal being indicated by the external test code signal;
   a first register unit electrically coupled to the decoder, the first register unit receiving in parallel the plurality of first test signals from the decoder, the first register unit outputting in series the plurality of first test signals as a plurality of second test signals;
   a second register unit electrically coupled to the first register unit, the second register unit receiving in series the plurality of second test signals from the first register unit, the second register unit outputting in parallel the plurality of second test signals as a plurality of third test signals; and
   a control unit electrically coupled to the second register unit, the control unit receiving in parallel the plurality of third test signals from the second register unit, the control unit controlling operation of a memory cell array in response to the plurality of third test signals.

2. The semiconductor device according to claim 1, wherein the first register unit comprises a plurality of first registers connected to each other, each of the plurality of first registers is electrically coupled to the decoder, each of the plurality of first registers receives a corresponding first test signal of the plurality of first test signals, each of the plurality of first registers except for the first register on a final stage of the first register unit transfers the corresponding first test signal as a corresponding second test signal to the first register on a next stage, the first register on the final stage of the first register unit outputs in series the plurality of second test signals.

3. The semiconductor device according to claim 2, wherein the second register unit comprises a plurality of second registers connected to each other, the second register on a first stage is electrically coupled to an output of the first register on the final stage of the first register unit, each of the plurality of second registers except for the second register on a final stage of the second register unit transfers sequentially the corresponding second test signal as a corresponding third test signal to the second register on a next stage.

4. The semiconductor device according to claim 3, wherein the number of the plurality of first registers is the same as the number of the plurality of second registers.

5. The semiconductor device according to claim 3, further comprising:
   a data output terminal coupled to the second register on the final stage of the second register unit,
   wherein the second register on the final stage sequentially transfers the third test signals to the data output terminal.

6. The semiconductor device according to claim 2, wherein the first register on a first stage of the first register unit receives a fixed potential.

7. The semiconductor device according to claim 2, wherein the first register on a first stage of the first register unit receives a first stage input signal having a fixed pattern.

8. The semiconductor device according to claim 2, wherein the second register on the final stage of the second register unit is electrically coupled to the first register on a first stage of the first register unit.

9. The semiconductor device according to claim 2, wherein the control unit comprises a plurality of control circuits, each of the plurality of control circuits is electrically coupled to a corresponding one of the plurality of the second registers, and each of the plurality of control circuits receives a corresponding one of the plurality of third test signals from the corresponding one of the plurality of the second registers.

10. The semiconductor device according to claim 9, wherein the plurality of control circuits are disposed in a peripheral circuit area that is adjacent to the memory cell array, the plurality of second registers are disposed, which have correspondences with the plurality of control circuits.

11. The semiconductor device according to claim 1, wherein the decoder generates first and second register control signals in response to the test code signal,
   the decoder supplies the first register control signal to the first register control unit, and
   the decoder supplies the first and second register control signals to the second register control unit.

12. The semiconductor device according to claim 11, wherein the first register unit outputs in series the plurality of first test signals as the plurality of second test signals in response to the first register control signal, and
   the second register unit receives in series the plurality of second test signals from the first register unit in response to the first register control signal, the second register unit outputs in parallel the plurality of second test signals as the plurality of third test signals in response to the second register control signal.

13. A semiconductor device comprising:
   a decoder that generates first and second register control signals in response to an external test code signal;
   a first register unit coupled to the decoder, the first register unit receiving the first register control signal from the decoder, the first register unit outputting in series a plurality of test signals in response to the first register control signal; and
   a second register unit coupled to the first register unit, the second register unit receiving the first and second register control signals from the decoder, the second register unit receiving in series the plurality of test signals from the first register unit in response to the first register control signal, the second register unit outputting in parallel the plurality of test signals in response to the second register control signal.

14. The semiconductor device according to claim 13, further comprising:
a control unit coupled to the second register unit, the control unit receiving in parallel the plurality of test signals from the second register unit.

15. The semiconductor device according to claim 14, further comprising:
a memory cell array coupled to the control unit, the control unit controlling operations of the memory cell array in response to the plurality of test signals.

16. The semiconductor device according to claim 15, wherein the second register unit is disposed closer to the memory cell array than the first register unit.

17. The semiconductor device according to claim 14, wherein
the first register unit comprises:
a plurality of first registers connected in series to each other, the plurality of first registers being connected in parallel to the decoder, a first register of the plurality of first registers receiving the test signal activated by the decoder, and the plurality of first registers allowing the test signal to be sequentially transferred through the series connection of the plurality of first registers,
the second register unit comprises:
a plurality of second registers connected in series to each other, the plurality of second registers being connected in series to the plurality of first registers, the plurality of second registers allowing the first test signal to be sequentially transferred through the series connection of the plurality of second registers, and
the control unit comprises:
a plurality of control circuits connected in parallel to the plurality of second registers.

18. The semiconductor device according to claim 13, further comprising:
a data output terminal coupled to the second register on the final stage of the second register unit,
wherein the second register on the final stage sequentially transfers the third test signals to the data output terminal.

19. A semiconductor device comprising:
a decoder that activates a test signal of a plurality of test signals;
a plurality of first registers connected in series to each other, the plurality of first registers being connected in parallel to the decoder, a first register of the plurality of first registers receiving the test signal activated by the decoder, and the plurality of first registers allowing the test signal to be sequentially transferred through the series connection of the plurality of first registers;
a plurality of second registers connected in series to each other, the plurality of second registers being connected in series to the plurality of first registers, the plurality of second registers allowing the first test signal to be sequentially transferred through the series connection of the plurality of second registers; and
a plurality of control circuits connected in parallel to the plurality of second registers, the plurality of control circuits receiving in parallel the plurality of test signals from the plurality of second registers.

20. The semiconductor device according to claim 19, further comprising:
a memory cell array coupled to the control unit, the control unit controlling operations of the memory cell array in response to the plurality of test signals.

* * * * *